United States Patent
Posner et al.

(10) Patent No.: US 7,231,191 B2
(45) Date of Patent: Jun. 12, 2007

(54) SPURIOUS RATIO CONTROL CIRCUIT FOR USE WITH FEED-FORWARD LINEAR AMPLIFIERS

(75) Inventors: Richard D. Posner, Woodland Hills, CA (US); Ross James Wilkinson, Bristol (GB)

(73) Assignee: Powerwave Technologies, Inc., Santa Ana, CA (US)

( * ) Notice: Subject to any disclaimer, the term of this patent is extended or adjusted under 35 U.S.C. 154(b) by 684 days.

(21) Appl. No.: 10/052,801

(22) Filed: Oct. 29, 2001

(65) Prior Publication Data

US 2003/0064738 A1    Apr. 3, 2003

Related U.S. Application Data

(60) Provisional application No. 60/325,627, filed on Sep. 28, 2001.

(51) Int. Cl.
H04B 1/04    (2006.01)
(52) U.S. Cl. .................................................. 455/114.3
(58) Field of Classification Search ................ 330/151; 375/296, 297; 455/114.3, 126–127.5, 114.2, 455/115.1
See application file for complete search history.

(56) References Cited

U.S. PATENT DOCUMENTS

| | | | |
|---|---|---|---|
| 4,412,185 A | 10/1983 | Gerard | |
| 5,077,532 A | 12/1991 | Obermann et al. | 330/151 |
| 5,444,418 A | 8/1995 | Mitzlaff | |
| 5,594,385 A | 1/1997 | Anvari | 330/149 |
| 5,610,554 A | 3/1997 | Anvari | 330/52 |
| 5,877,653 A * | 3/1999 | Kim et al. | 330/149 |
| 5,959,500 A | 9/1999 | Garrido | |
| 6,061,568 A | 5/2000 | Dent | |
| 6,104,241 A | 8/2000 | Cova | |
| 6,166,601 A | 12/2000 | Shalom et al. | |
| 6,172,560 B1 | 1/2001 | Yamashita et al. | |
| 6,263,289 B1 * | 7/2001 | Hassun et al. | 702/69 |

FOREIGN PATENT DOCUMENTS

EP    0 986 168 A2    3/2000
WO    WO 01/50594 A1    7/2001

* cited by examiner

*Primary Examiner*—Curtis Kuntz
*Assistant Examiner*—Alexander Jamal
(74) *Attorney, Agent, or Firm*—Myers Dawes Andras & Sherman LLP

(57) ABSTRACT

A control system for a linear feed-forward amplifier, using the ratio of measured spurious energy. Measuring receivers are coupled to two monitoring points to measure the spurious energy content in the error signal and at the main output of a feed-forward amplifier. The control system measures the ratio of these detected spurious, and uses this to optimize the settings of the second loop distortion cancellation. With the addition of an extra monitoring point, the same technique may also be used to control an adaptive predistorter prior to the main amplifier.

4 Claims, 10 Drawing Sheets

SPURIOUS RATIO CONTROL CIRCUIT FOR USE WITH FEED-FORWARD LINEAR AMPLIFIERS

CROSS-REFERENCE TO RELATED APPLICATION

This application claims the benefit of U.S. Patent Application No. 60/325,627, filed Sep. 28, 2001, the contents of which are hereby incorporated by reference.

BACKGROUND OF THE INVENTION

The present invention relates to electronic communication systems, and more particularly to systems in which multiple signals are simultaneously transmitted at varying power levels.

In electronic communication systems, it is often necessary that groups of information signals be amplified and transmitted simultaneously. For example, a cellular radio base station transmitter typically transmits signals to many active receiving mobile stations within a single geographic cell. The signals typically appear at multiple predetermined frequencies in such multi-carrier signals. Similarly, a satellite communications transponder amplifies and transmits large number of information signals destined for various participating remote stations. Because such systems customarily employ a frequency division multiple access (FDMA) scheme, in which information signals are modulated on signal carriers occupying several frequency channels within an allocated frequency band, care must be taken to avoid inter-channel interference which may corrupt signal transmissions.

One possible source of such cross-channel interference is known as intermodulation distortion (IMD), which may result when two or more signals of different frequencies are mixed. For example, if two carriers of different frequencies are amplified using a non-linear amplifier, spurious outputs occur at the sum and difference of integer multiples of the original carrier frequencies.

As described in detail below, third order intermodulation products resulting from two relatively strong signals may disrupt transmission of a third relatively weak signal being transmitted on a carrier having a frequency equal to the frequency of the intermodulation product.

Various solutions have been proposed for improving linearity and reducing inter-channel effects in multi-carrier amplifiers. One such solution is the feed-forward amplifier circuit. In the feed-forward amplifier two loops are used to cancel distortion. In a first loop, a portion of the signals at the input to the amplifier are fed forward and, following suitable amplitude and phase adjustment, are subtracted from the amplifier output to generate an error signal. The error signal is proportional to distortion components of the output. The first loop that generates the error signal is known as the signal-cancellation loop. The error signal is then amplified, phase-adjusted and subtracted from the amplifier output to give a corrected signal output with reduced distortion effects. This portion of the circuit is known as the error-cancellation loop.

In one design, a "pilot tone" is introduced to the first loop of the feed-forward amplifier (i.e. signal cancellation loop). Then, the amplitude and phase adjustments in the error cancellation loops are performed by varying the amplitude and phase until a desired output is obtained. The adjustments made in this manner, however, are inherently narrowband and give optimal amplifier performance only at a certain frequency.

Other possible approaches to multi-channel linearization are described in U.S. Pat. No. 5,077,532, in which a microprocessor adjusts the feed-forward circuits, based on spectral analysis of the amplifier output signal; and in U.S. Pat. No. 5,455,537, in which a broadband pilot signal is used. An article by Parsons, et al., entitled "A Highly-Efficient Linear Amplifier for Satellite and Cellular Applications," in IEEE Globecom, Vol. 1 (December 1995), pp. 203–207, suggests combining analog predistortion with feed-forward linearization. PCT patent publication WO98/12800 describes an RF power amplifier that combines feed-forward correction with adaptive digital predistortion. An RF signal output by the power amplifier is down-converted and sampled, and the average power of this signal is used as an input to a look-up table, so as to vary the values of complex gain applied to the input signal to the amplifier and to a feed-forward error signal.

Accordingly, it would be desirable to provide other techniques which reduce intermodulation distortion to, for example, compensate for non-linearities introduced by power amplifiers in multi-carrier environments.

Those having skill in the art would understand the desirability of having a spurious ratio circuit for use with feed-forward linear amplifiers. This type of spurious ratio circuit for use with feed-forward linear amplifiers would necessarily tend to more completely cancel in-band distortion, thus allowing the linearity of the amplifier to be improved.

SUMMARY OF THE INVENTION

The present invention therefore provides a spurious ratio controlled linear feed-forward amplifier comprising a linear feed-forward amplifier having a first monitoring point coupled to a first loop, and a second monitoring point coupled to the linear feed-forward amplifier output is provided. A control system having a first input coupled to the first monitoring point, a second input coupled to the second monitoring point, a third input coupled to a source of frequency information, and a control output coupled to a control input of the error-cancellation loop of the linear feed-forward amplifier.

In accordance with another aspect of the present invention a spurious ratio controlled feed-forward amplifier comprising a signal source producing a multi-carrier input signal, an input sampling coupler having an input coupled to an output of the signal source, a first phase and gain adjusting circuit having an input terminal coupled to an output of the input sampling coupler, a main amplifying device having an input terminal coupled to an output of the phase and gain adjusting circuit and an output terminal at which an amplified signal is provided. Wherein, the amplified signal comprises an amplified input signal component and a spurious signal component.

A distortion sampling coupler having an input coupled to the output terminal of the main amplifier, a first delay line having an input port coupled to an output of the input sampling coupler, a summing coupler having an input coupled to an output of the first delay line, and an injection port coupled to a forward port of the distortion sampling coupler is provided. A first monitoring coupler having an input connected to the output of the summing coupler and a coupled port forming the first monitoring point is provided. A second delay line having an input coupled to the distortion sampling coupler output, and providing a delayed amplified signal at the error signal injection coupler input and a second monitoring coupler having an input coupled to an output of the error signal injection coupler are provided.

A second phase and gain adjusting circuit having an input coupled to the output of the summing coupler and an error amplifier having an input coupled to an output of the second phase and gain adjusting circuit, and an error amplifier output coupled to a coupled port of the error signal injection coupler are provided. A control system having a first input coupled to the first monitoring point, a second input coupled to the second monitoring point, a third input coupled to a frequency information output of the signal source, and a control output coupled to the control input of the second gain and phase adjusting circuit is also provided.

In accordance with still another aspect of the present invention, a method of adjusting a linear feed-forward amplifier, the method comprising, monitoring a first spurious component at a first monitoring point by a control system, monitoring a second spurious component at a second monitoring point by the control system, comparing the levels of the second spurious component to the first spurious component to form a ratio, and adjusting the feed-forward linear amplifier through a control output of the control system is provided. Whereby, the ratio of the second spurious component to the first spurious component is minimized, thus optimizing the adjustment of the error-canceling loop.

In accordance with a further aspect of the present invention a method of adjusting the predistorter of a feed-forward amplifier having a first monitoring point coupled to the predistorter output, a second monitoring point coupled to the output of the first loop, a control system having a first input coupled to the first monitoring point, a second input coupled to the second monitoring point, a third input coupled to a source of frequency information, and its control outputs coupled to the control inputs of the feed-forward linear amplifier. The method comprises monitoring a first spurious component at the first monitoring point by the control circuit, monitoring a second spurious component at the second monitoring point by the control circuit, comparing the levels of the second spurious component to the first spurious component in the control circuit to form a ratio, and adjusting the control inputs of the feed-forward linear amplifier so that the ratio of the spurious component of the second spurious component to the first spurious component is minimized, thus optimizing the adjustment of the predistorter.

Many of the attendant features of this invention will be more readily appreciated as the same becomes better understood by reference to the following detailed description considered in connection with the accompanying drawings.

DESCRIPTION OF THE DRAWINGS

These and other features and advantages of the present invention will be better understood from the following detailed description read in light of the accompanying drawings, wherein.

Like reference numerals are used to designate like parts in the accompanying drawings.

DETAILED DESCRIPTION OF THE INVENTION

The detailed description provided below in connection with the appended drawings is intended as a description of the present embodiments of the invention and is not intended to represent the only forms in which the present invention may be constructed or utilized. The description sets forth the functions of the invention and the sequence of steps for constructing and operating the invention in connection with the illustrated embodiments. However, the same or equivalent functions and sequences may be accomplished by different embodiments that are also intended to be encompassed within the spirit and scope of the invention.

Although the present invention is described and illustrated herein as being implemented in a cellular telephone system, the system described is provided as an example and not a limitation. As those skilled in the art will appreciate, the present invention is suitable for application in a variety of different types of amplifier systems.

Figure 1:
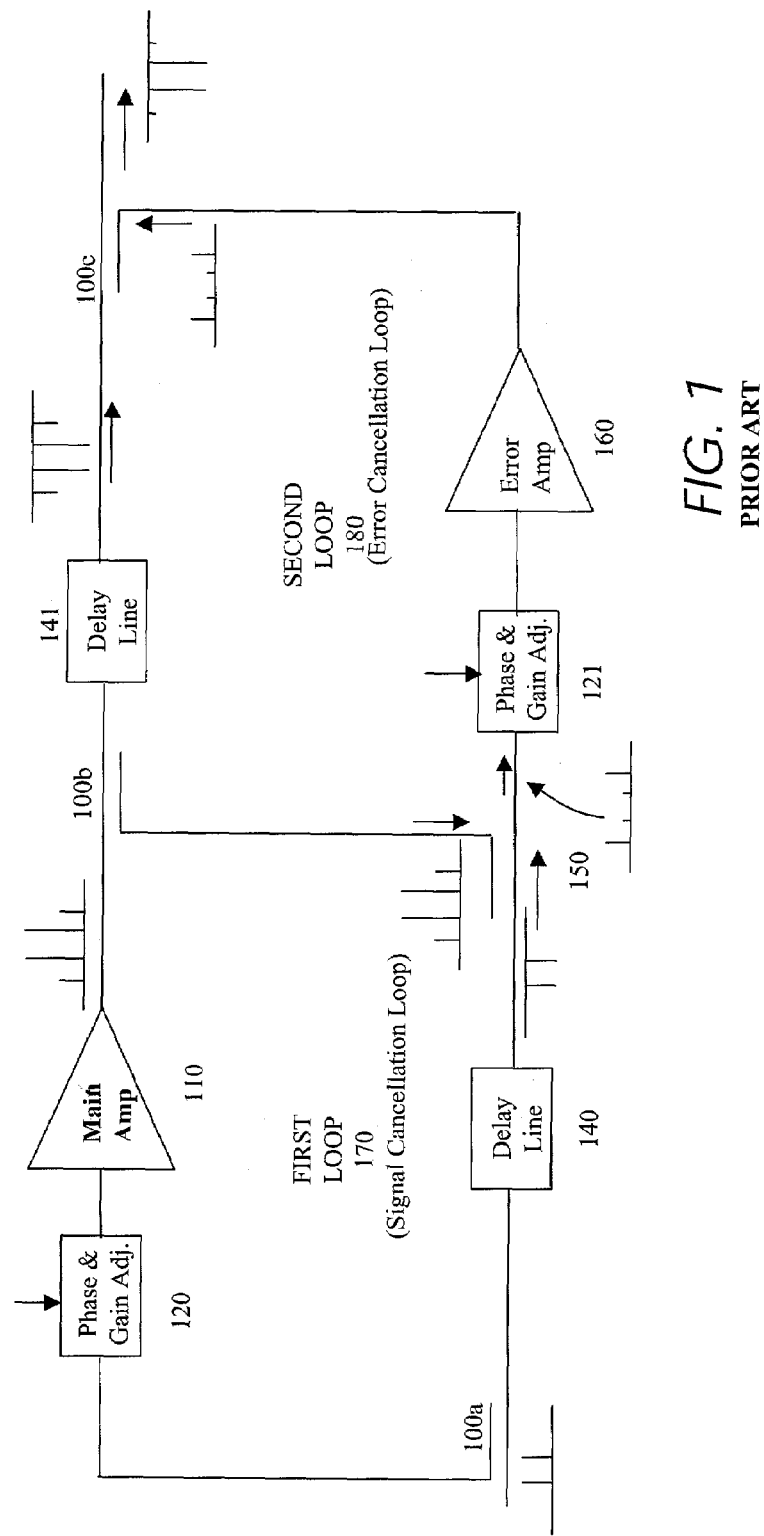
FIG. 1 is a block diagram of a conventional feed-forward amplifier.

FIG 1. is a block diagram of a conventional feed-forward linear amplifier. An input signal is applied to coupler 100*a* which couples portions of the input signal to delay line 140 and to main amplifier 110. Main amplifier 110 produces an amplified output having intermodulation products generated due to non-linearities in main amplifier 110. A portion of the amplified output signal is coupled to summer 150 by coupler 100*b*. Delay line 140 delays the input signal with respect to the output of the amplifier 110 producing a delayed signal such that the two signals reach summer 150 at approximately the same time, but reversed in phase.

The output of summer 150 is an error signal which is coupled to auxiliary amplifier 160. Auxiliary amplifier 160 increases the amplitude of the error signal producing an error correction signal. The error correction signal should be matched in amplitude to the intermodulation products (i.e. spurious component) generated by main amplifier 110 and delay line 141, but reversed in phase. The resultant vector cancellation of the intermodulation products is performed in coupler 100*c* where the error correction signal is subtracted from the amplified input signal. The vector cancellation must be performed with a high degree of accuracy. If the error correction signal is matched in amplitude and phase to the intermodulation products, the error correction signal can completely cancel the intermodulation products of the main amplifier. However, even with the high-precision components used in the amplifier, the error signal in reality cannot completely cancel the spurious component generated by main amplifier 110. In general, complete cancellation requires that the error correction signal be maintained with greater than 0.5 degrees phase accuracy and 0.1 dB amplitude accuracy which is difficult to achieve in production.

The feed-forward technique can be used in a multi-carrier power amplifier to effectively suppress intermodulation products, but at the cost of lower power efficiency and a high demand on complexity and component cost. In particular, high power multi-carrier power amplifiers are difficult to master in production.

Figure 2:
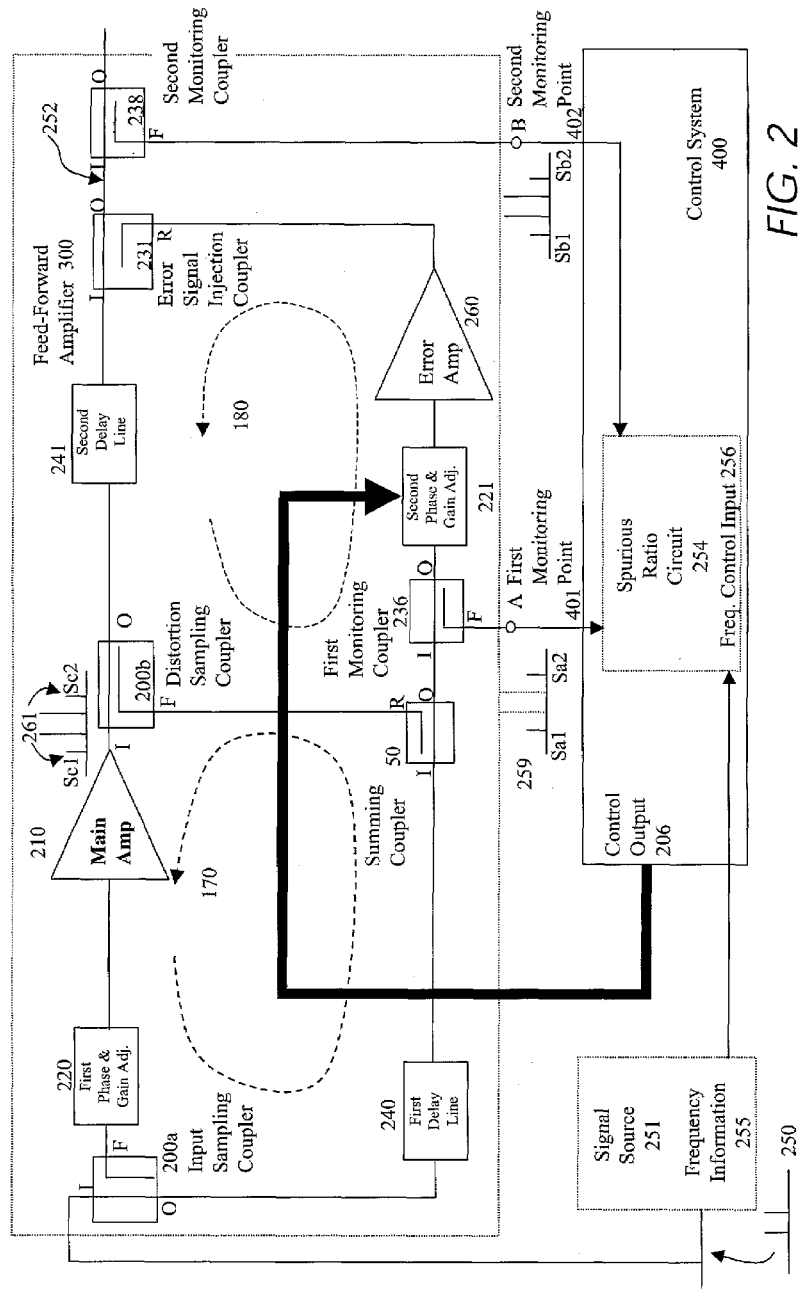
FIG. 2 is a first embodiment of a feed-forward amplifier system having a control system including a spurious ratio circuit.

FIG. 2 is a first embodiment of a feed-forward amplifier system having a control system 400 including a spurious ratio circuit 256. The spurious ratio circuit 256 is coupled to a feed-forward amplifier 257, such as a feed-forward power amplifier, at two monitoring points. The feed-forward amplifier has two monitoring points at A and B. The control system 400 produces an output that is coupled to phase and gain adjustment circuits in the feed-forward amplifier. Frequency information derived from an input signal source 251 is coupled to the spurious detection circuit 254.

Prior knowledge of the frequencies being transmitted is utilized by the spurious detection circuit to measure distortion. In many communication systems such as cellular telephone systems, for example, the frequencies being amplified and subsequently transmitted are known. Transmitting frequency information is typically available from a bank of synthesizers, and is often available over a control bus. Exemplary control buses include RS232, RS485, TCP/IP, and I2C. The knowledge of transmitted frequencies may be used in conjunction with an amplifier control system described below in a manner that tends to reduce distortion. Equivalently, knowledge of transmitted frequencies may be obtained from input signal presets, or by a scanning circuit coupled to the amplifier input to determine which frequencies are present.

A conventionally modulated input signal 250, typically including multiple carriers, is coupled to an input, I, of a conventionally constructed input sampling coupler 200a. Forward sampled port F of the input sampling coupler 200a is coupled to an input of a conventionally constructed first phase and gain adjusting circuit 220. An output of the first phase and gain adjusting circuit is coupled to an input of a conventionally constructed main amplifier 210.

Main amplifier 210 typically creates intermodulation distortion 261 and harmonic distortion (not shown). The exemplary intermodulation distortion is produced from the two tones shown in the exemplary input signal 250. In a multi carrier transmission system the intermodulation distortion typically falls within the band of transmission and can not be satisfactorily filtered out. Harmonic distortion typically falls out of band and may be filtered out. Thus, it is desirable to utilize methods such as that of the present invention to reduce intermodulation distortion.

The exemplary input signal 250 shown is coupled to the main amplifier 210, through the two previous circuits 200a, 220, and is typically free of distortion and contains two signals located at two frequencies. Prior to application to the main amplifier 210 the input signal is phase-adjusted and gain attenuated, utilizing conventional techniques known to those skilled in the art, by the phase and gain controller 220. A control signal input to the phase and gain controller 220 is coupled to the control system 400 (not shown). Main amplifier 210 generates an amplified output of the two input signals, and produces distortion, that typically includes two third order intermodulation spurious components Sc1 and Sc2.

The output of the main amplifier is coupled to the input, I, of a conventionally constructed distortion sampling coupler 200b. Output, O, of the distortion sampling coupler 200b is coupled to an input of a conventionally constructed second delay line 241. An output of the second delay line 241 is coupled to an input, I, of a conventionally constructed error signal injection coupler 231. An output, O, of the error signal injection coupler 231 is coupled to an input, I of a conventionally constructed second monitoring coupler 238. An output O of second monitoring coupler 238 is the feed-forward amplifier 300 output.

Returning to the input, the input sampling coupler 200a couples a sample of the input signal to the first coupler forward port F. The input sampling coupler output port, O, is coupled to a first port of a conventionally constructed first delay line 240. A second terminal of the first delay line 240 is coupled to an input, I, of a conventionally constructed summing coupler 50. A reverse coupled port (injection port), R, of the summing coupler 50 is coupled to a forward coupled port, F, of the distortion sampling coupler 200b. An output, O, of summing coupler 50 is coupled to an input of conventionally constructed first monitoring coupler 236. The output, O of first monitoring coupler 236 is coupled is connected to an input of a conventionally constructed second phase and gain adjustment circuit 221.

An output of the second phase and gain adjusting circuit 221 is coupled to an input of a conventionally constructed error amplifier 260. An output of error amplifier 260 is coupled to a reverse (injection) port, R, of the error signal injection coupler 231.

A forward coupled port, F, of the first monitoring coupler 236 forms a first monitoring point A. A forward coupled port, F, of the second monitoring coupler 238 forms the second monitoring point B. A control system 400 having a first input 401 and a second input 402 is coupled to monitoring points A and B respectively. A control output 206 of control system 400 (the control output 206 originating from the spurious detection circuit 254) is coupled to the phase and gain adjusting circuit 221. The conventionally constructed signal source 251 typically includes a frequency information output 255 that is coupled to a frequency control input 256 of the control system 400.

Couplers 200a, 200b, 231, 238, 236 and 50 have been described as directional couplers. However, those skilled in the art will realize that circuits such as ninety-degree hybrids, in-phase signal splitters and the like may be used to perform an equivalent function.

In the first, signal cancellation loop, summing coupler 50 subtracts a delayed and undistorted input signal 250, typically including multiple carriers, from a portion of a distorted amplified input signal 261, to produce a difference signal, typically called an error signal 259 having intermodulation distortion (IMD) products (Sa1, Sa2), with the carriers tending to be cancelled. The distortion components in the error signal Sa1, Sa2 are located at the same frequency as distortion components Sc1 and Sc2 of amplified input signal 261. The amplitudes of the distortion components Sa1, Sa2 in the error signal 259 are proportional to the amplitudes of distortion products Sc1 and Sc2 of the amplified input signal 261.

In the second loop, the error signal 259 is phase and gain adjusted by phase and gain controller 221 and applied to the error amplifier 260 to produce an amplified error signal in which the distortion components have amplitudes comparable to those of distortion products Sc1 and Sc2 of the amplified input signal.

The amplified error signal is coupled to a reverse port, R, of an error signal injection coupler (or equivalently, a summer) 231 in order to cause cancellation of the spurious components of the amplified input signal 261 that has been delayed by a second delay line 241. The error correction signal applied to port R of error signal injection coupler 231 is adjusted such that they are matched in amplitude, but reversed in phase, as compared to the spurious components of the amplified input signals generated by main amplifier 210. Amplitude matching and phase reversal of the error correction signals tends to cancel the spurious components at the feed forward amplifier output (port 0 of error signal injection coupler 231).

The phase of the error signal applied to port R of error signal injection coupler 231 should be 180 degrees offset from the phase of the delayed signal output from the main amplifier that is coupled to port I of the error signal injection coupler 231. Also, the amplitudes should be substantially equal. However, it is often difficult to obtain complete cancellation of the distortion, the output signal of the feed-forward amplifier 252, often contains a small residual of the two spurious signals Sc1 and Sc2. The residual spurious components typically remain after vector cancellation of the spurious components is performed in error signal injection coupler, (or summer) 231, where the amplified error signal is added to the amplified input signal. Furthermore, in some cases, the spurious components of the amplified input signal not only contain the intermodulation products of the input signals, but also noise generated by main amplifier 210.

In the first embodiment of the invention a ratio of spurious signals is utilized for second loop control. Loop control utilizing a ratio of spurious energy tends to be most useful with input signals having dynamic power changes. Control signals generated by the ratio of spurious energy signals are typically utilized to control the second loop. The first loop is typically controlled by conventional methods known to those skilled in the art. A control system 400, and circuitry contained in it 254 is coupled to the feed-forward amplifier, at two separate monitoring points, A and B. The control system is utilized to monitor the spurious components of the signals present at desired points in the feed-forward amplifier 300. Based on the ratio of the levels of spurious components present in the signals at monitoring points A and B, the control system 400 provides control signals 206 to control the second loop control present in the second phase and gain adjusting circuit 221. By monitoring the spurious components of the signals at points A and B, the ratios of the levels of spurious components of the two signals at monitoring points A and B is determined utilizing typical conventional circuit design techniques.

Knowledge of the instantaneous ratios of the levels of the signals present at the monitoring points A and B is obtained, typically by coupling samples of the desired signals. The control system 400 of the amplifier optimizes the transfer characteristics of the second, or error correction loop, utilizing control signals derived from the instantaneous ratios. Optimization tends to minimize the ratio of the spurious signals measured at the output 252 of the entire feed-forward linear amplifier (proportional to sampled signals Sb1, Sb2) to the spurious components measured at the output of the signal-cancellation loop (proportional to the sampled signals Sa1, Sa2). By minimizing the ratios of the levels of the distortion components rather than seeking to absolutely minimize the distortion components measured at the amplifier output 252, the controller is better able to reduce distortion when the feed-forward amplifier is coupled to dynamically-varying signals. The ratio calculated is proportional to the cancellation in the error-correction loop, which in a linear feed-forward amplifier tends to be independent of changes in input signal level.

Figure 3:
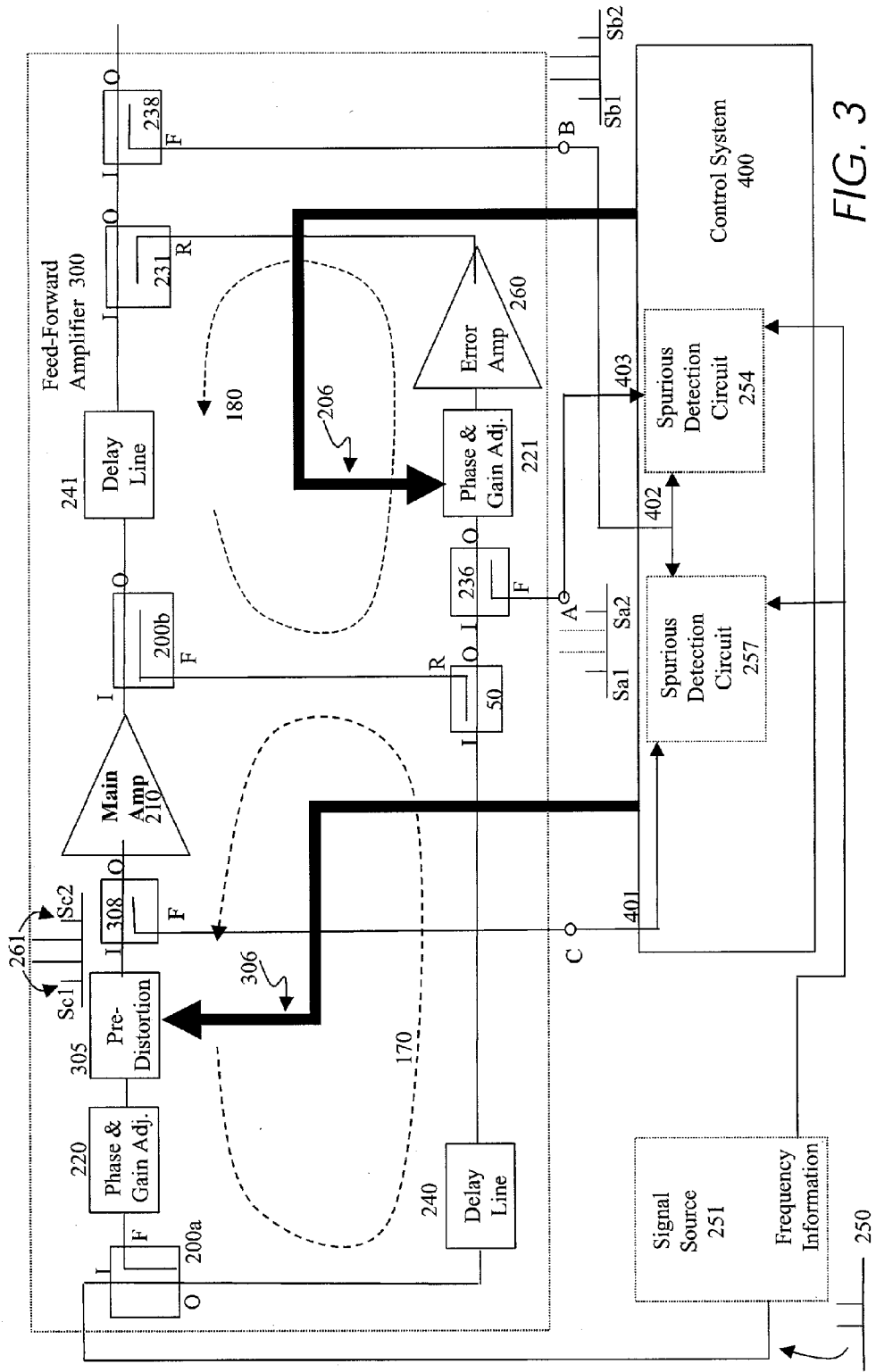
FIG. 3 is an alternative embodiment of a feed-forward amplifier incorporating a predistorter and having a spurious ratio circuit with sampling at predistorter output.

FIG. 3 is an alternative embodiment of a feed-forward amplifier incorporating a predistorter and having a spurious ratio circuit with sampling at the main amplifier output 252. In the alternative embodiment shown the first loop 170 including the conventionally constructed predistortion circuit 305 that has been added, are controlled by conventional methods known to those skilled in this art, and the second loop 180 is controlled by the spurious ratio, as previously described.

In the embodiment shown, the conventionally constructed predistortion circuit 305, accepts a control signal 306, generated by the spurious detection circuits 257 and 254 coupled to the control system 400, to adaptively control the amount of predistortion applied to main amplifier 210. The predistortion circuit 305 is typically coupled to the first loop after the phase and gain controller 320, and prior to the main amplifier 210. However, those skilled in the art will appreciate that the predistortion unit may, equivalently be placed at various locations prior to the main amplifier. The phase and gain adjustment of the first loop is provided by the phase and gain circuit 220. Phase and gain adjusting circuit 220 is controlled by conventionally generated control signals (not shown) from the control system 400.

Predistortion unit 305 generates a distortion signal to compensate for non-linear distortion produced by the main amplifier 210. Because the amplifier characteristics change over time and in response to changing operating conditions, predistortion can be applied adaptively in response to control output signals 206 received from the control system 400. In the alternative embodiment of the present invention, the control system 400 of the linear feed-forward amplifier 300 controls the predistortion unit 305, utilizing conventionally constructed control circuitry 400 known to those skilled in the art, for generating an optimized predistortion signal that typically tends to compensate for the non-linearities of the main amplifier 210.

Control signals 206 and 306 are derived from monitoring distortion levels present at various monitoring points in the feed-forward amplifier circuit, and subsequently comparing the ratios of these distortion levels in the spurious detection circuits 257, 254 of the control system 400. As shown, the spurious detection circuits 257, 254 of the control system 400 monitor the distortion at points A, B and C of the amplifier. The control signals generated by the spurious detection circuits 257, 254 and coupled through the control system 400 to the first loop predistortion circuit 306 and the second loop phase and gain adjusting circuit 221 tend to optimize the performance of the predistorter and the error-cancellation loop 180 of the amplifier.

In a manner similar to that used to adjust the amplifier shown in FIG. 2, the control system monitors the output of the entire feed-forward amplifier as before at point A and point B.

However, with the addition of the predistortion circuit, the control system monitors the output of predistortion unit 305 at monitoring point C, by the addition of a coupler 308 having an input I coupled to the predistorter 305 output and a coupler output O coupled to the main amplifier 210 input. Monitoring point C is coupled to the forward port F of coupler 308. Monitoring point C is monitored for the purpose of determining the signal strength of the spurious component (i.e. Sc), as measured at the output of the predistortion circuit.

The spurious outputs of the main amplifier 210 are similarly measured at points A and B as previously described. The cancellation of the error-canceling, or second, loop can be determined by the ratio of the distortion at B with respect to A, while the optimization of the predistorter can be determined by the ratio of the distortion at A with respect to C.

The control system 400, utilizing the ratio data obtained from spurious detection circuits 257 and 254 will then generate, utilizing methods known to those skilled in the art, a control output 206 which is applied to the gain and phase control input of gain and phase adjusting circuit 221. Control output 206 controls the error correction loop (second loop) of the amplifiers in such a way as to optimize its cancellation by minimizing the ratios of spurious energy between B and A. In addition, the predistortion unit 305 is controlled by control output 306 so as to minimize the ratio of spurious energy between A and C.

Figure 4:
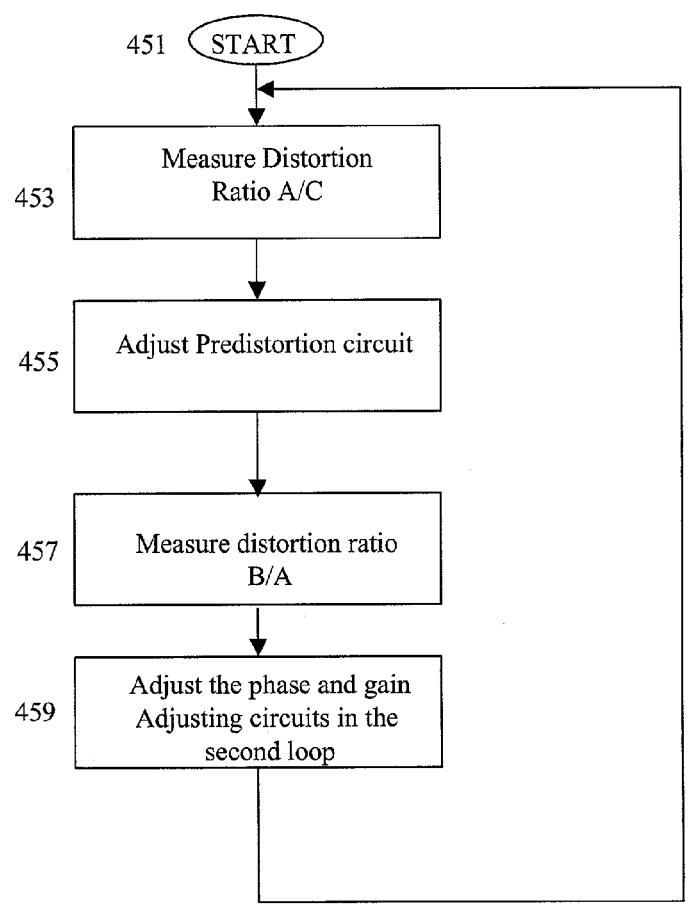
FIG. 4 is a flow diagram of an embodiment of a method of controlling a feed-forward amplifier utilizing a spurious ratio.

FIG. 4 is a flow diagram of an embodiment of a method of controlling a feed-forward amplifier utilizing a spurious ratio. The first (signal-cancellation loop) is controlled by conventional methods as known to those skilled in the art, such as by power-minimization. Optimization of the second loop is typically more difficult with a pilot-less error-cancellation loop. However, the method described tends to produce the desired optimization without a pilot signal. In the embodiment previously shown in FIG. 3, three monitoring points, located at A, B, and C, are shown. The control system 400 (of FIG. 3) tends to minimize the ratios of the spurious components of the signals in a method including two steps: (1) the predistortion unit is controlled to minimize the ratio of spurious signals measured within the first loop at A, with respect to C; and (2) the error cancellation loop is controlled to minimize the ratio of spurious signals at B, with respect to A, as before. The processes could run concurrently, however this would require three receivers and two parallel processes. The lower-cost implementation could use two receivers and sequential processes as described above.

The adjustment process is typically initiated by the amplifier control system during typical operation. At the start of the process 451, the ratio A/C of the spurious components is measured 453. Next the predistortion circuit is adjusted 455 in a manner to minimize the previously measured ratio. Next the distortion ratio B/A is measured 457. After the measurement the phase and gain circuits are adjusted 459 in a manner that tends to reduce the distortion. The adjustment process needs to run continuously, since the amplifier response is constantly changing. Thus, the process loops back to the start 451.

In the present embodiments, the strength of the spurious component in the amplified output signals can be measured by a narrowband receiver connected at the output of the feed-forward amplifier at point B. By making a measurement of the same bandwidth at the output of main amplifier, at point A, a reference signal strength is provided. Finally, circuitry taking the ratio of the power in the two spurious components will then give an instantaneous measure of the cancellation achieved which is independent of input signals dynamics.

Figure 5:
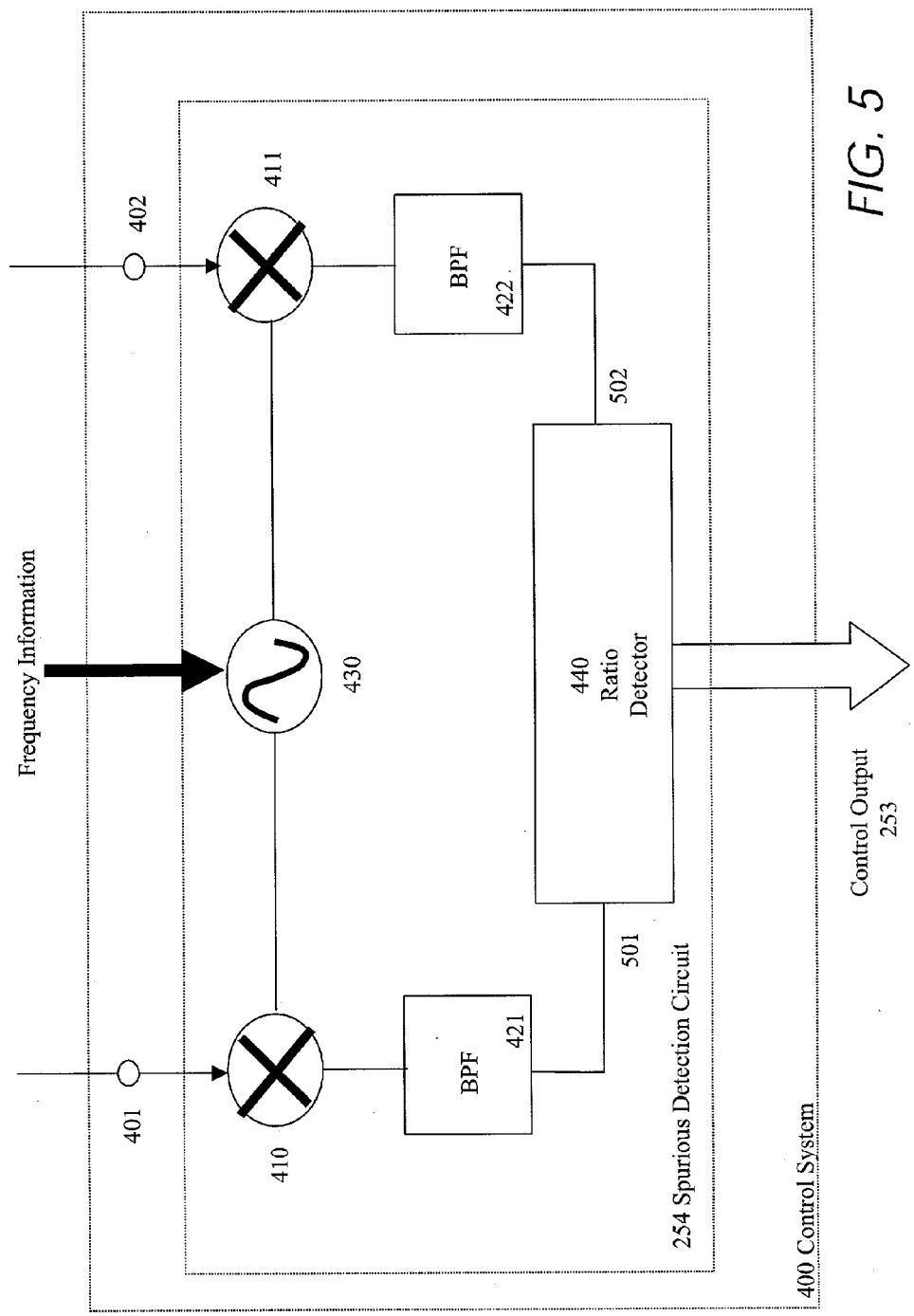
FIG. 5 is a block diagram of a control system having a spurious ratio circuit.

FIG. 5 is a block diagram of a control system 400 having a spurious ratio circuit 254. The control system shown includes typically constructed feed-forward amplifier control circuits (typically including a microprocessor) for generating control signals to optimize distortion cancellation. Also included in the control circuit is an embodiment of a spurious detection circuit. The exemplary spurious detection circuit 254 is shown as part of the overall feed-forward control system. However, those skilled in the art will appreciate that the spurious detection circuit may be disposed external to the control system.

As will be appreciated by those skilled in the art the spurious detection circuit 254 is a pair of receiver circuits that mix down and filter a desired frequency component to a low frequency signal. In the embodiment shown the desired frequency components include IMD distortion products measured at varying locations within the feed-forward amplifier. After down conversion and filtering of the signals to form low frequency signals suitable for comparison, the signals are compared as a ratio by a ratio detector 440.

In the embodiment shown the pair of monitor signals are coupled to the control system through two input terminals 401, 402. The input terminals 401, 402 are coupled to a first conventionally constructed mixer 410 first input, and a second conventionally constructed mixer, 411 first input, respectively. In a first embodiment monitoring points A and B are coupled to input terminals 401 and 402 respectively. In an alternative embodiment monitoring points A and C are coupled to input terminals 401 and 402 respectively.

A conventionally constructed local oscillator provides frequencies that convert the distortion products that are to be compared, down to low frequency signals. The local oscillator is programmed to provide frequency outputs based on frequency information provided by the signal source (251 of FIG. 2 and FIG. 3).

As will be appreciated by those skilled in the art, local oscillators are often constructed having a local oscillator control input coupled to the source of frequency information that directs an oscillator to tune to various frequencies in order to convert one or more signals disposed about a center frequency down to a low frequency. Knowledge of the frequencies being amplified in the feed-forward amplifier allows the frequencies of the distortion products that are generated in the feed-forward amplifier to be calculated by methods known to those skilled in the art. Once the frequencies of the desired distortion signals are known, a suitable local oscillator signal is produced, by methods known to those skilled in the art, to mix the distortion product down to a low frequency.

A first output of a conventionally constructed local oscillator 430 is coupled to the first mixer 410 at a second input terminal. A second output of the conventionally constructed oscillator is coupled to a second input of the second mixer 411. In the mixers each of the two signals applied to each of the mixer's first inputs are down converted frequency to form two down converted monitoring signals. The local oscillator frequency at the first and second oscillator outputs are set to down convert a desired spurious component to a desired low frequency signal.

After the frequency mixing to create a pair of down converted signals, conventionally constructed band pass filters 421, 422 are constructed to pass the spurious components of the two down converted monitoring signals. A pair of filtered down converted spurious signals is thus produced. The output of the first mixer 410 is coupled to an input of a first band pass filter 421. The output of the second mixer 411 is coupled to an input of a second band pass filter 422. Then the two spurious components are coupled to a ratio detector 440 at a first ratio detector input and a second ratio detector input.

A conventionally constructed ratio detector 440 compares, utilizing conventionally known circuit design techniques, each of the two filtered down converted spurious signals of the pair of filtered spurious signals. Those skilled in the art will realize that the ratio detector could be analogue circuitry, or a digital signal processor. A first filtered spurious signal is coupled from the output of the first band pass filter 421 to a first input of the ratio detector 440. A second filtered spurious signal is coupled from the output of the second band pass filter 422 to a second input of the ratio detector 440.

The output of the ratio detector 440 is processed by the control system 400 utilizing methods known to those skilled in the art, to generate a control output that is coupled to the second phase and gain adjusting circuit (221 of FIG. 2 or FIG. 3). The control output acts on the phase and gain circuits in a way that tends to optimize the error-cancellation loop, and hence minimize the amplifier distortion by controlling the phase and gain distortion circuits to minimize the ratios between the two spurious components. According to an alternative embodiment of the present invention, the system performance of the entire amplifier can be optimized by controlling the predistortion circuit and the phase and gain adjusting circuit 221 to minimize the ratios between the two pairs of spurious components.

Returning to the embodiment of FIG. 2, the two monitoring points are A and B. Thus, the error-cancellation loop performance can be optimized by minimizing the instantaneous ratios of the spurious components. The spurious components compared are those measured at the output of the entire feed-forward amplifier after the second loop, to those measured at the output of the main amplifier.

Returning to the alternative embodiment of FIG. 3, the performance is similarly affected, the monitoring points are coupled to terminal A and terminal C in order to optimize the predistortion unit performance, and to terminal A and terminal B, as previously described, to optimize settings of the error-cancellation loop.

Figure 6:
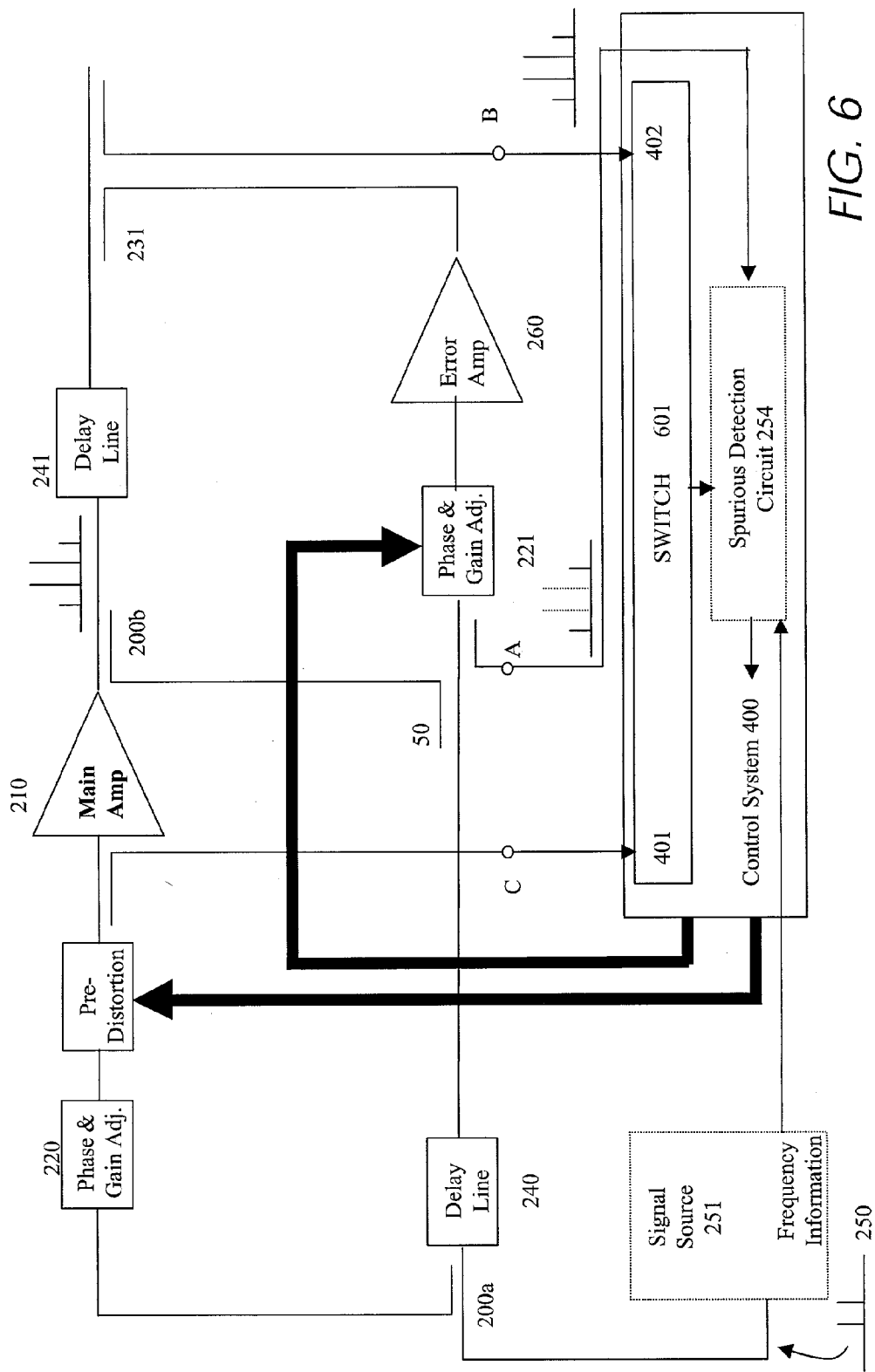
FIG. 6 is a block diagram of a second embodiment of a feed forward amplifier with spurious ratio detector, including a switch to periodically sample monitoring points A, B and C.

FIG. 6 is a block diagram of a second embodiment of a feed-forward amplifier with a spurious ratio detector, including a switch to periodically sample monitoring points B and C (point A being monitored continuously). Where an adaptive predistorter 305 is included, the ratios A/C and B/A are measured. A first input of the spurious detector 254 is directly coupled to monitoring point A, a second input of the spurious detector 254 is coupled to the output of a switch 501. Monitoring point C is coupled to a first input of switch 501. Monitoring point B is coupled to a second input of switch 501. The switch 501 switches between C and B.

Figure 7:
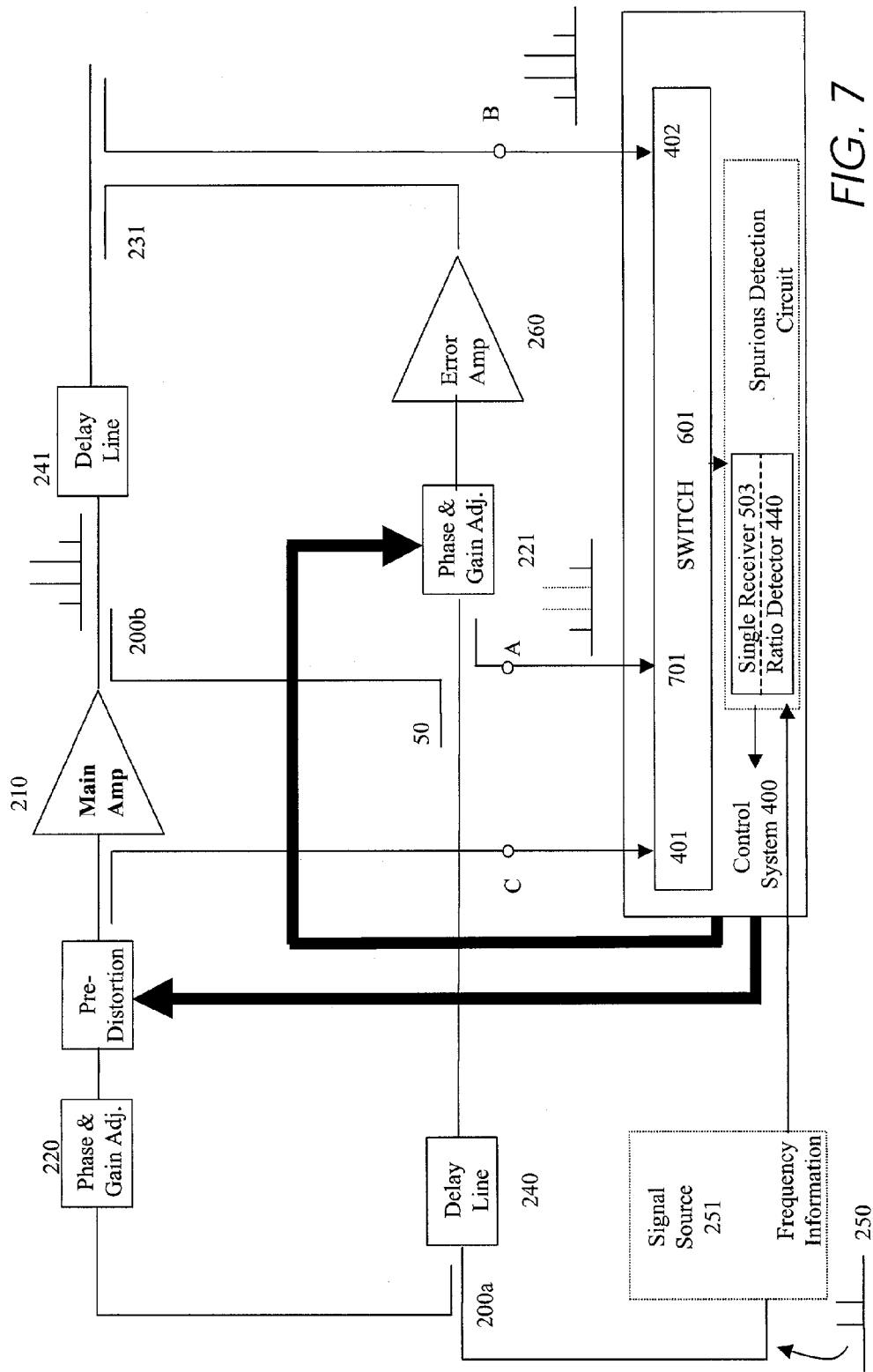
FIG. 7 is a block diagram of a third embodiment of a feed forward amplifier including a spurious ratio detector with a single receiver and a three way switch to periodically sample monitoring points A, B and C.

FIG. 7 is a block diagram of a third embodiment of the feed-forward amplifier including a spurious ratio detector with a single receiver and a three way switch to periodically sample monitoring points A, B and C. This embodiment is used where the signal dynamics tend to be slow. It may be used in place of the two receiver design shown in the spurious detection circuit (254 of FIG. 5). A single receiver such as 430, 410 and 421 of FIG. 5 is used to form receiver 503. Sampling is achieved by switching the single receiver 503 between two or three of the monitor points A, B and C, and sequentially sampling the distortion power from each.

A single receiver 503 typically comprises a conventionally constructed mixer having a distortion signal coupled to a first input port, and a second input port coupled to an output port of a conventionally constructed local oscillator. A mixer output port is coupled to an input port of a conventionally constructed band pass filter. A band pass filter output is coupled to a conventionally constructed ratio detector.

Conventionally constructed memory circuits are included in the ratio detector, for holding the measured values of distortion prior to determining their ratio. As will be appreciated by those skilled in the art the memory circuits may be analog or digital in their construction. The local oscillator signal is tuned, by methods known to those skilled in the art, to an appropriate local oscillator frequency, depending upon which distortion signal is being applied to the receiver 503. This embodiment works only where the signal dynamics are slowly changing with respect to the switching rate.

Figure 8:
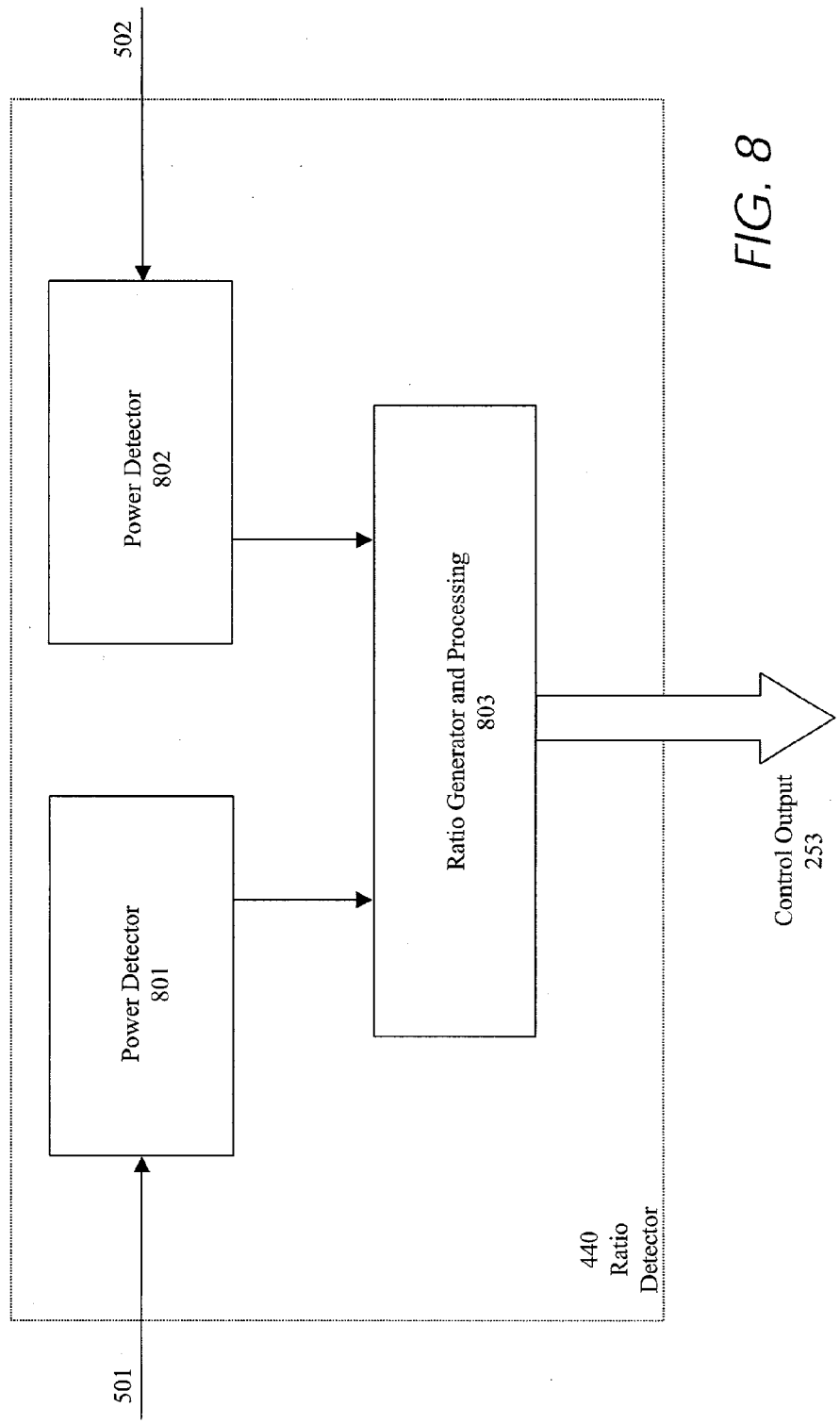
FIG. 8 is a block diagram of a ratio detector.

FIG. 8 is a block diagram of a ratio detector. The band-pass filtered intermediate low-frequency outputs from the receiver 501, 502 are coupled to power detectors, 801 and 802, which measure their levels. A ratio-generation circuit 803 then produces an output proportional to the ratio of these two voltages. Those skilled in the art will realize that a DSP including further signal processing, typically including further signal filtering as well as ratio detection and a control process may be utilized to generate the control outputs.

Figure 9:
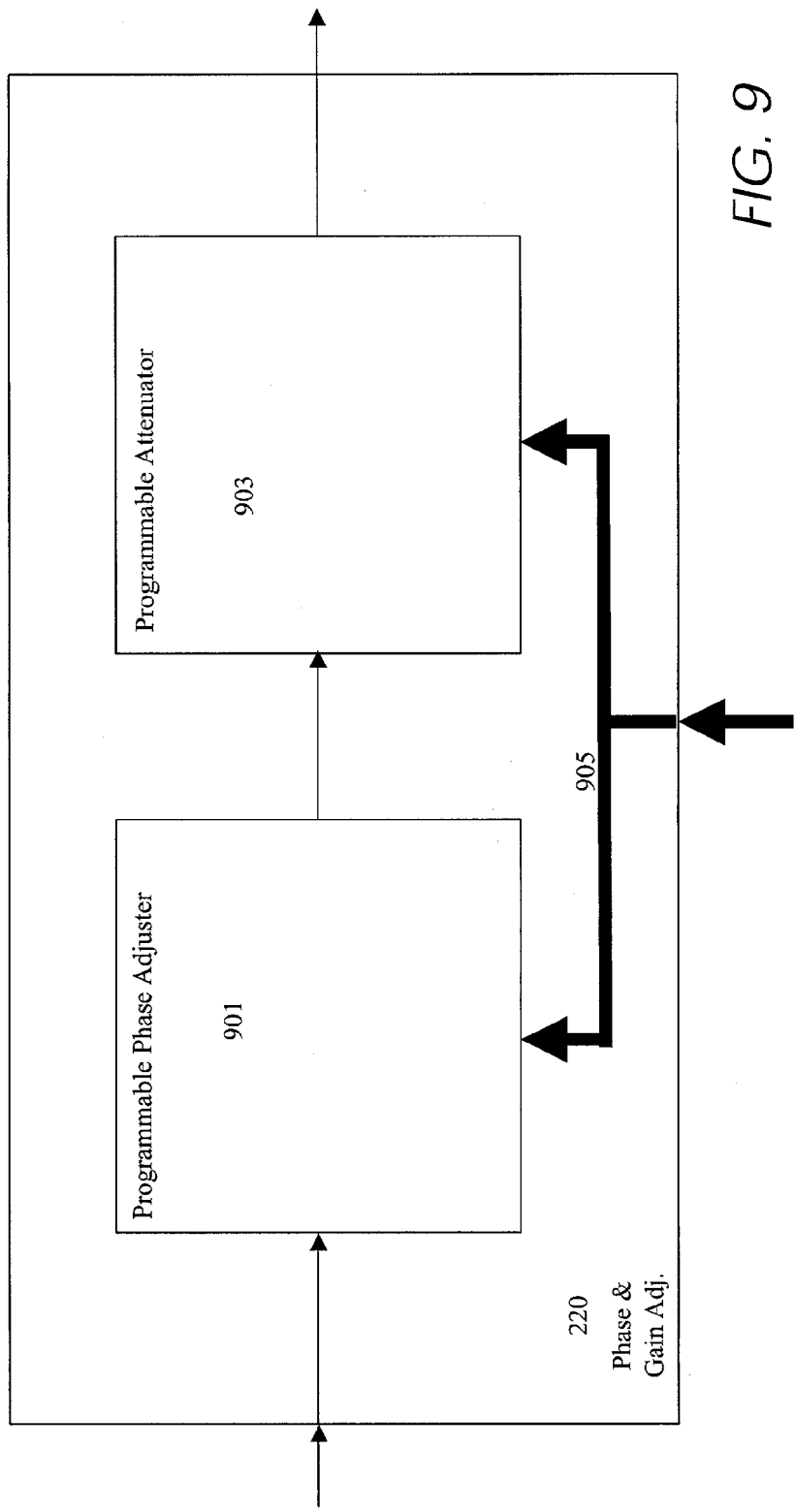
FIG. 9 is a block diagram of a first programmable phase and gain adjusting circuit.

FIG. 9 is a block diagram of a first programmable phase and gain adjusting circuit 220. In the embodiment shown a conventionally constructed programmable phase adjuster 901 is coupled to a conventionally constructed programmable attenuator 903 to adjust signal strength and phase. The circuits utilize conventional interface circuitry to achieve programmability via standard digital control techniques. The circuits accept commands transmitted over a conventionally constructed control bus 905. In alternative embodiments conventional analog control is utilized. Alternatively, as will be appreciated by those skilled in the art, digital control circuitry may be utilized.

Figure 10:
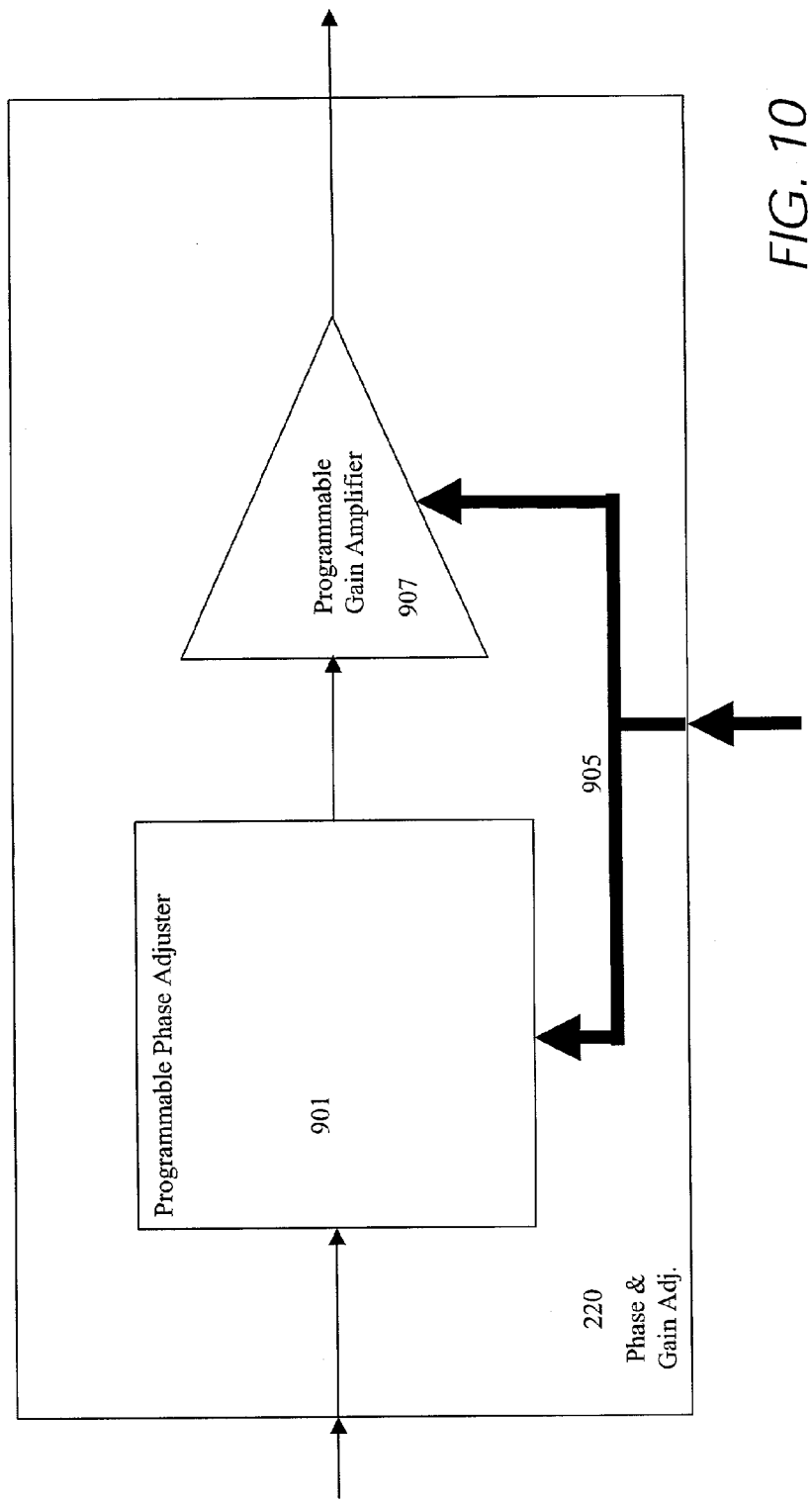
FIG. 10 is a block diagram of a second programmable phase and gain adjusting circuit.

FIG. 10 is a block diagram of a second programmable phase and gain adjusting circuit. In the embodiment shown a conventionally constructed programmable phase adjuster 901 is coupled to a conventionally constructed programmable gain amplifier 907 to adjust gain and phase. The circuits incorporate conventional interface circuitry to achieve programmability via standard digital control techniques. The circuits accept commands transmitted over a conventionally constructed control bus 905. In alternative embodiments conventional analog control is utilized. Alternatively, as will be appreciated by those skilled in the art, digital control circuitry may be utilized.

The foregoing description has been limited to a specific embodiment of this invention as utilized in conjunction with a feed-forward amplifier. It will be apparent, however, that variations and modifications may be made to the invention, with the attainment of some or all of the advantages of the invention. For example the invention may be equivalently practiced in any feed-forward amplifier implementation which monitors the cancellation in the second loop of the feed-forward amplifier. The circuit is broadly applicable to a class of amplifiers known as cross-cancellation amplifiers. Therefore, it is the object of the appended claims to cover all such variations and modifications as come within the true spirit and scope of the invention.

The invention claimed is:

1. A spurious ratio controlled feed-forward amplifier comprising:
 a signal source producing a multi-carrier input signal;
 an input sampling coupler having an input coupled to an output of the signal source;

a first phase and gain adjusting circuit having an input terminal coupled to an output of the input sampling coupler;

a main amplifying device having an input terminal coupled to an output of the phase and gain adjusting circuit and an output terminal at which an amplified signal is provided, wherein the amplified signal comprises an amplified input signal component and a spurious signal component;

a distortion sampling coupler having an input coupled to the output terminal of the main amplifier;

a first delay line having an input port coupled to an output port of the input sampling coupler;

a summing coupler having an input coupled to an output of the first delay line, and an input port coupled to a forward port of the distortion sampling coupler;

a first monitoring coupler having an input coupled to an output of the summing coupler and a coupled port forming a first monitoring point;

a second delay line having an input coupled to a distortion sampling coupler output, and providing delay to the amplified signal to produce an inverted amplified signal at a second delay line output;

a second monitoring coupler having an input coupled to an output of an error signal injection coupler;

a second phase and gain adjusting circuit coupled to the first monitoring coupler;

an error amplifier having an input coupled to an output of the second phase and gain adjusting circuit, and an error amplifier output coupled to a coupled port of the error signal injection coupler; and a differential spurious ratio control system having a first input coupled to the first monitoring point, a second input coupled to the second monitoring point, a third input coupled to a frequency information output of the signal source, and a control output coupled to a control input of the second gain and phase adjusting circuit;

a first narrowband receiver coupled to the first monitoring point for capturing the spurious component at the output of the summing coupler;

a second narrowband receiver coupled to the second monitoring point for capturing the spurious component of an output signal of the feed-foward amplifier;

and wherein the control system further comprises a ratio detector having a first ratio detector input coupled to a first narrowband receiver output, and a second ratio detector input coupled to a second narrowband receiver output, for detecting the ratio of the spurious component at the output of the sampling coupler and the spurious component of the feed-forward amplifier output signal.

2. The feed-forward amplifier according to claim 1, wherein the spurious signal component includes an intermodulation product of the multi-carrier input signal.

3. The feed-forward amplifier according to claim 1, wherein the spurious signal component includes noise generated by the main amplifier.

4. The feed-forward amplifier according to claim 1, further comprising a pre-distortion circuit coupled between the first gain and phase adjusting circuit and the main amplifying device.

* * * * *